United States Patent
Brown et al.

(10) Patent No.: US 6,703,269 B2
(45) Date of Patent: Mar. 9, 2004

(54) METHOD TO FORM GATE CONDUCTOR STRUCTURES OF DUAL DOPED POLYSILICON

(75) Inventors: Jeffrey J. Brown, Hopewell Junction, NY (US); Len Y. Tsou, New City, NY (US); Qingyun Yang, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 1 day.

(21) Appl. No.: 10/114,829

(22) Filed: Apr. 2, 2002

(65) Prior Publication Data

US 2003/0186492 A1 Oct. 2, 2003

(51) Int. Cl.$^7$ .......................... H01L 21/8238
(52) U.S. Cl. ................. 438/199; 438/301; 438/589
(58) Field of Search ................. 438/197, 199, 438/286, 301, 303, 305, 592–595, 589, 735

(56) References Cited

U.S. PATENT DOCUMENTS 5,480,830 A * 1/1996 Liao et al. ................. 438/199
5,751,048 A * 5/1998 Lee et al. ................... 257/412
6,521,963 B1 * 2/2003 Ota et al. ................... 257/412

* cited by examiner

Primary Examiner—Phat X. Cao
Assistant Examiner—Theresa T. Doan
(74) Attorney, Agent, or Firm—McGinn & Gibb, PLLC; Todd M. C. Li

(57) ABSTRACT

A method for manufacturing a semiconductor chip which has transistors is disclosed. The transistors include first type transistors which have a first type of doping and second type transistors which have a second type of doping different than the first type of doping. The method includes forming a conductive layer on a substrate. The conductive layer includes first regions that have the first type of doping and second regions have the second type of doping. The invention patterns a mask over the conductive layer, and the mask protects portions of the conductive layer where gate conductors will be located. Next, the invention partially etches unprotected portions of the conductive layer. The partially etching process allows a layer of the unprotected portions to remain, such that the substrate is not exposed by the partially etching process. The invention forms a passivating layer on exposed vertical surfaces of the conductive layer and completely etches unprotected portions of the conductive layer to expose the substrate. The invention then dopes exposed portions of the substrate to form source/drain regions.

20 Claims, 3 Drawing Sheets

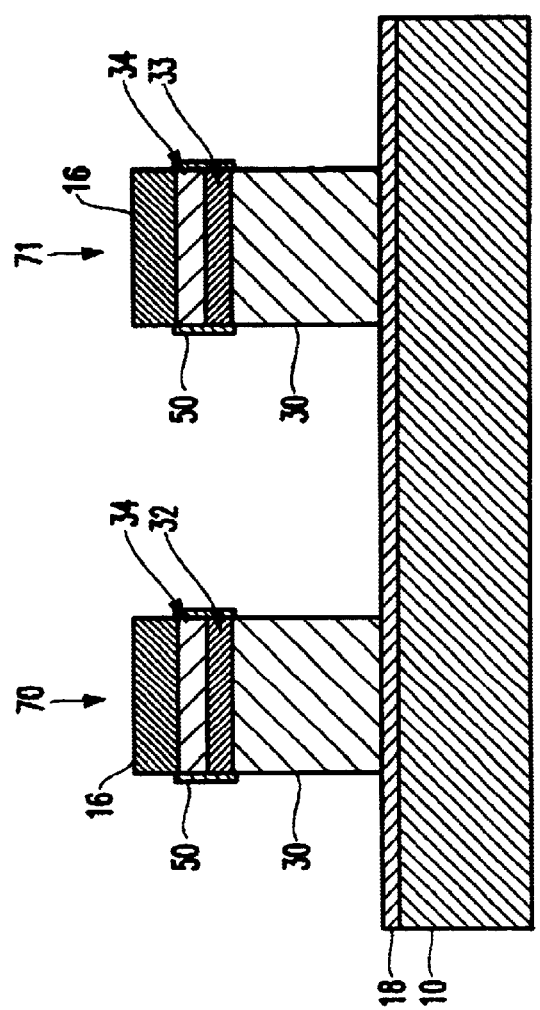
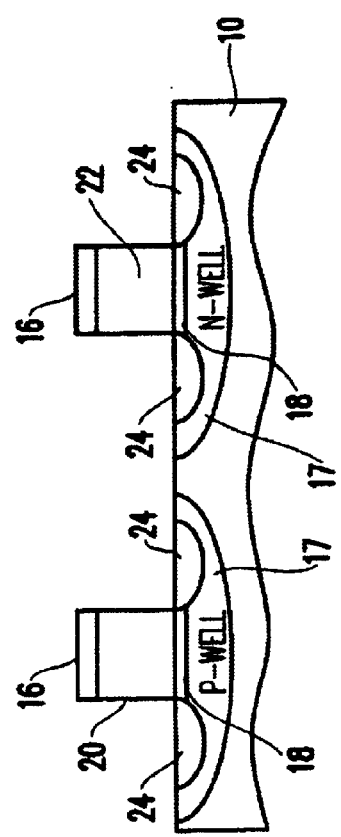
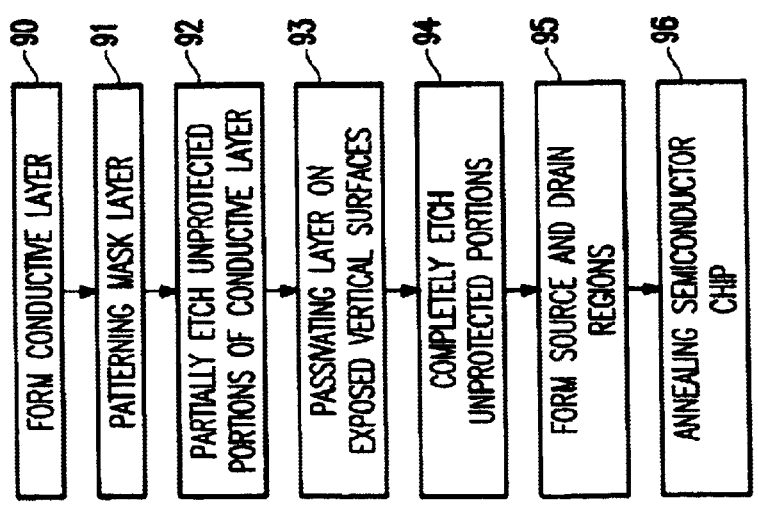

METHOD TO FORM GATE CONDUCTOR STRUCTURES OF DUAL DOPED POLYSILICON

BACKGROUND OF THE INVENTION

1. Field of the Invention

The present invention generally relates to a process for manufacturing semiconductor transistors and more particularly to an improved process for simultaneously forming N-type and P-type transistor gates on an integrated chip substrate.

2. Description of the Related Art

As the technologies surrounding integrated circuit chips progress, numerous advances have been made to reduce the size of transistors as well as to simplify the manufacturing process. Generally, such advances strive to reduce the size and cost of the integrated circuit chip while increasing the operating speed of the chip. In addition, it is important to simplify the manufacturing process so as to reduce the amount of time required to manufacture integrated circuit chips and to increase the yield of the manufacturing process.

One recent advance in complementary metal oxide semiconductor (CMOS) manufacturing processes that increases the device's speed, makes it necessary to simultaneously form N and P doped transistors gates on a single integrated circuit substrate. By simultaneously forming these different types of transistors, the number of steps in the manufacturing process is reduced, which makes the manufacturing process faster and less-expensive.

One example (which is not necessarily prior art) of this processing is shown in FIGS. 1 and 2. More specifically, FIG. 1 illustrates a semiconductor chip that includes a substrate 10 (for example, silicon), well regions 17 (N and P type, respectively), a gate oxide layer 18 and a conductor layer over the gate oxide layer 18. The conductor layer, typically a semiconductor material such as polysilicon, includes differently doped regions including a N-type region 12 and a P-type region 14. The polysilicon layer is selectively doped with N and P type dopants in different parts of the chip by ion implant using a patterned mask.

In addition, FIG. 1 illustrates a patterned mask 16, typically a hard mask of material such as nitride, TEOS, thermal oxide, or the like, that is used to pattern the conductor layer 12, 14 into gate conductors. Conventionally, a plasma etch process is used in conjunction with the mask 16 to remove portions of the conductor 12, 14 that are not protected by the mask. This processing produces N-type and P-type gate conductors 20 and 22, respectively. Subsequently, impurities are implanted into the substrate (preferably using the mask 16 to self-align these implants) to form source/drain regions 24. The gate conductors are doped separately from the source/drain regions 24 because different impurities are used in the gate conductors and in the source/drain regions 24. In early generation N devices, the gate conductor 20 and source/drain 24 were both doped with arsenic. In current generation devices, it is now preferable to dope the N gate conductor 20 with phosphorus first and subsequently dope the source/drain 24 with arsenic after the formation of the gate conductor 20. The P dopant in the gate makes for a faster operating device. By contrast, P devices are typically doped differently than N devices, for example, by doping the gate conductor 22 with boron ions and then doping the source/drain with $BF_2$ ions after the formation of the gate conductor 22.

Improved processing attempts to integrate process steps to simultaneously form N-type and P-type gate structures. For example, such processing dopes different regions of the conductor layer using an ion implant method that localizes doping in a region within the conductor layer, followed by an annealing step to spread the dopant. The annealing process can occur before or after the formation of the gate stack by patterned etching with the hard mask 16. In this integration scheme, it is necessary to pattern the gate structures containing both N-doped poly and P-doped poly. The challenge is similar to that with N and P doped gates. However, a problem exists in that the impurity used for the N-type gate conductor 20 causes the N-type gate conductor 20 to suffer substantially more erosion during the plasma etch process when compared to the P-type gate conductors 22. This is schematically demonstrated in FIG. 2 where the N-type gate conductor 20 is shown to have excessive etching when compared to the P-type gate conductor 22. The performance of such a device will suffer because of the erosion to the critical dimension (CD) and gate profile.

Conventional processing can result in vertical P-type gate profiles, but cause differential lateral etching of the N-doped regions. Aggressive anisotropic etching minimizes such differentials; however, such aggressive anisotropic etching may cause damage to the gate oxide. The alternative of processing N-type and P-type structures separately is more costly. The invention described below provides an integrated processing scheme that allows the formation both N-type and P-type structures that have the desired vertical profiles and critical dimensions without significant additional cost or complexity to the processing. An alternative to the foregoing process involves etching the N-type gate conductors separately from the P-type gate conductors. However, this alternative requires additional masking and etching steps because one type of gate conductor must be protected during the etching of the other gate conductor and vice versa. Therefore, this alternative is not attractive because it adds additional manufacturing steps, which increases the cost and time needed to manufacture an integrated circuit chip. In addition, this processing may introduce additional impurities which reduce yield. It is also important to be able to obtain same profile and critical dimensions for the gate of N doped, P doped, and undoped devices, which is difficult to achieve with conventional methods.

Therefore, there is a need to improve the manufacturing process that simultaneously etches differently doped conductors, without resulting in excessive erosion of the N-type gate conductors. The invention described below provides a solution that adds a minimum number of processing steps, yet achieves the goal of producing substantially equivalently shaped N-type and P-type gate conductors in a simultaneous etching process.

SUMMARY OF THE INVENTION

It is therefore, an object of the present invention to provide a method for manufacturing a semiconductor chip which has transistors. The transistors include first type transistors which have a first type (e.g., P-type) of doping and second type transistors which have a second type (e.g., N-type) of doping that is different than the first type of doping. The method forms a conductive layer on a substrate. The conductive layer includes first regions that have the first type of doping and second regions that have the second type of doping. The invention patterns a mask over the conductive layer, and the mask protects portions of the conductive layer where gate conductors will be located. Next, the invention partially etches unprotected portions of the conductive layer, such that a layer of the unprotected portions remain. The substrate is not exposed by the partially etching process. The invention forms a passivating layer on exposed vertical surfaces of the conductive layer and completely etches unprotected portions of the conductive layer to expose the substrate. The invention then dopes exposed portions of the substrate to form source/drain regions 24.

The conductive layer includes a lower layer of undoped polysilicon, a middle layer of doped polysilicon, and an upper layer of undoped polysilicon. The partially etching process etches the unprotected portions of the conductive layer through the upper layer and the middle layer, and partially through the lower layer. The passivating layer is formed at least over vertical surfaces of the middle layer. The passivating layer is formed upon the vertical surfaces and on horizontal surfaces of the conductive layer and then removed from the horizontal surfaces. The forming of the passivating layer can also include oxidizing the vertical surfaces, nitridizing the vertical surfaces, depositing a nitride material, depositing an oxide material on the vertical surfaces, or polymerizing the conductive layer. The passivating layer protects sidewall portions of the conductive layer from lateral etching during the subsequent etching.

The invention solves the conventional over-etching problems by a sequence of steps that include first etching the gate into a depth just beyond the region of the dopant (before annealing and when the dopant is localized within a small depth region). Aggressive etching is performed so that lateral etching of the region containing the dopant is minimized. The next step is to form a passivation layer on the vertical surfaces of the partially formed gate structures of both N doped and P doped (or undoped) devices. Note that the passivation would occur on the horizontal surfaces at the same time as well. Further processing utilizes a less aggressive plasma etching to remove the remaining polysilicon layer (now that the doped region is protected, the less aggressive etching process is used to avoid damaging the oxide layer). The passivating layer prevents the N-type doped region of the gate conductor from suffering the excessive sidewall etching that is seen in the conventional processes.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 7 is a schematic diagram of a partially completed semiconductor chip;

FIG. 8 is a schematic diagram of a partially completed semiconductor chip; and

FIG. 9 is a flow diagram illustrating a preferred method of the invention.

DETAILED DESCRIPTION OF PREFERRED EMBODIMENTS OF THE INVENTION

Figure 1:
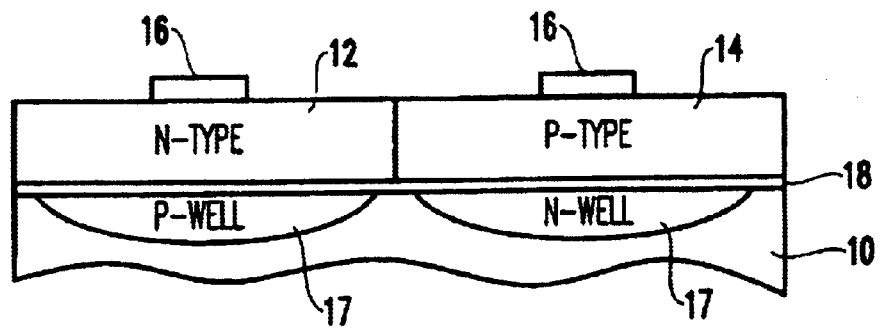
FIG. 1 is a schematic diagram of a partially completed semiconductor chip.

As discussed above, conventional integration methods involve implanting different dopants in different regions of a conductor layer followed by an annealing step (either before or after the patterned etch to form the conductor stack). However, this process can cause the N-type gate conductor to suffer substantially more erosion during the plasma etch process when compared to the P-type gate conductors 22.

The invention solves this problem with processing that implants different regions with N-type and P-type dopants to form locally doped regions, patterns a mask, performs partial aggressive anisotropic etching of both N-type, P-type (and possibly non-doped type) regions past the locally doped areas, forms a passivation layer, less aggressively anisotropic etches to complete the formation of the gate conductor stacks, and then spreads the dopant throughout gate conductor stack (for example, by annealing). Afterwards, processing continues as normal, for example, the source/drain regions are doped, etc.

An important distinction is made of the difference between the "aggressive anisotropic etch" and the "less aggressive anisotropic etch." A more aggressive etching process uses stronger etching chemicals (chemicals that will be more destructive to a certain material), higher energy, higher chemical concentrations, and/or higher flow rates, etc. when compared to less aggressive etching processes. One problem associated with more aggressive etching processes is that the aggressive anisotropic etch alone cannot be used for an integrated gate conductor scheme because it would break through the thin gate oxide layer and damage the substrate surface. Preferably, the gate oxide is used as a stopping layer for the final etch, which requires that a less aggressive etch. However, one significant problem with using less aggressive etching is that it tends to exaggerate the differences and etch rates between the N-type doped regions and the P-type dope regions.

Therefore, since less aggressive etching must be used in at least a portion of the processing, there is a need to eliminate the excessive lateral etching which occurs at the N-type gate conductor when a simultaneous less aggressive plasma etching process is utilized. The invention solves this problem using a sequence of steps that includes first etching the gate using an aggressive etch into a depth just beyond the region of the dopant (before annealing when the dopant is localized within a small depth region). By using an aggressive etch in this phase of the process, the etching difference between the N-type and P-type regions is minimized.

The next step is to form a passivation layer on the vertical surfaces of the partially formed gate structures of both N-doped and P-doped (or undoped) devices. Note that the passivation would form on the horizontal surfaces at the same time, but is subsequently removed. Further processing utilizes less aggressive plasma etching to remove the remaining polysilicon layer (now that the doped region is protected, less aggressive plasma processing conditions can be employed to avoid damaging the oxide stop layer). The passivating layer prevents the N-type doped region of the gate conductor from suffering excessive sidewall etching that is seen in the conventional processes. FIGS. 3–8 illustrate the processing utilized by the invention to achieve this benefit.

Figure 3:
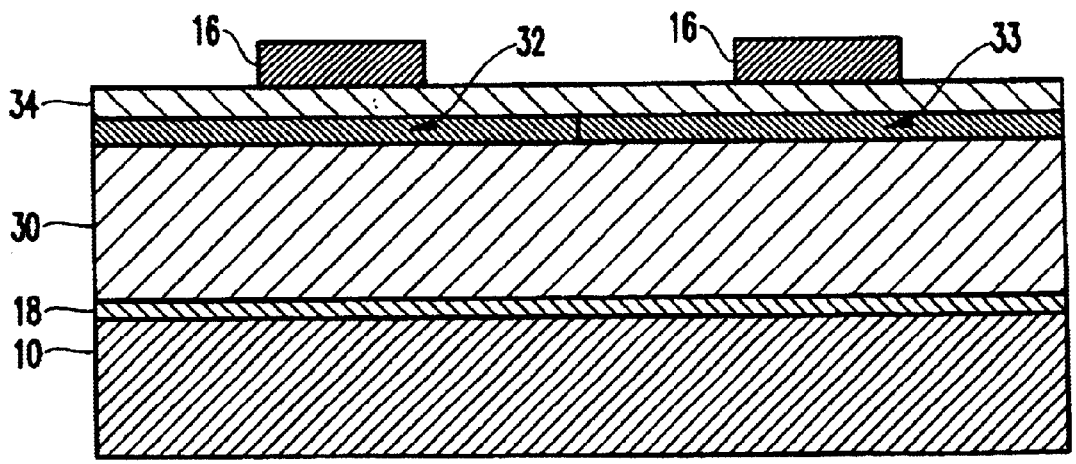
FIG. 3 is a schematic diagram of a partially completed semiconductor chip.

More specifically, FIG. 3 illustrates the substrate 10, the gate oxide 18 and the mask 16 discussed above. The materials and processes used to create these elements are very well known to those ordinarily skilled in the art and are not discussed in detail here so as not to unnecessarily obscure the salient features of the invention.

FIG. 3 also illustrates lower and upper layers 30, 34 that comprise undoped polysilicon and a localized doped region 32, 33. As discussed above, well known processes are utilized to selectively implant different impurities in the different regions 32,33. More specifically, in this example, impurity region 32 comprises an N-type impurity and impurity region 33 comprises a P-type impurity. In this example, the impurity regions are shown as being adjacent one another. However, in practice the impurity regions may be separated by physical barriers or spacing. The impurity regions are shown as being adjacent one another in the drawings for ease of illustration and to more clearly show the advantages of the invention. During subsequent annealing processes, the impurities contained within the doped region 32, 33 will migrate throughout the upper and lower undoped polysilicon regions 30, 34 to allow the entire conductive layer to include the proper N-type doping. Doped layer 32, 33 is formed by using a well-defined ion energy during the ion implant. Thus, the dopants are implanted into a small range of depth so that the polysilicon layer will contain three distinct regions (upper 34; middle 32, 33; and lower 30).

The distribution of an N-type and P-type impurities in the doped conductor layers 12, 14 shown in FIG. 1 is localized within a depth range but is uniformly distributed in the two horizontal dimensions. As mentioned above, after annealing, the N-type conductor layer 30, 32, 34 and P-type conductor layer 30,33,34 would also enjoy this same uniform N-type and P-type doping placement. As mentioned above, the P-type regions could simply be undoped regions.

It is preferable to delay the annealing process until after the gate conductors 20, 22 are formed so as to reduce the excessive erosion of the N-type gate conductor 20. However, simply delaying the annealing process has not been completely successful because the middle portion 32 of the N-type gate conductor still suffers substantial and unacceptable erosion when compared to the middle portion of the P-type gate conductor 33, especially during the less aggressive etching process. Again, the uneven erosion is primarily caused because the type of the impurity used to form the N-type gate conductor reacts extremely well with the etchant used in conventional plasma etching processes. Therefore, in addition to delaying the annealing process, this invention also utilizes a passivation layer to protect the portion of the gate conductor that includes a substantial amount of the N-type impurity (middle layer 32, 33), as discussed below.

Figure 4:
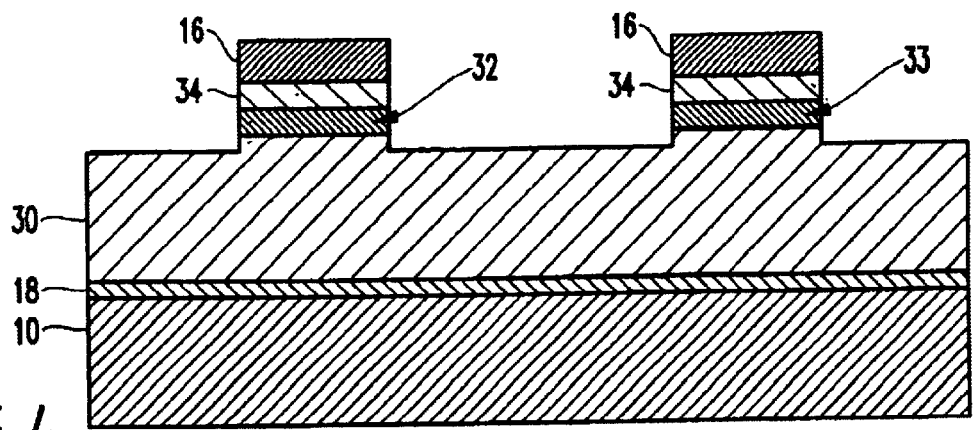
FIG. 4 is a schematic diagram of a partially completed semiconductor chip.

In FIG. 4, an aggressive anisotropic etch is utilized to completely etch away the upper layer 34 and the middle layer 32 in regions not protected by the mask 16 to form the top portions of the gate conductors. As discussed above, the parameters of the aggressive etching processes are selected such that there will be little difference in etch rates between the N-type doped region 32 and the P-type doped region 33. The etching process is continued so that a portion of the lower polysilicon layer 30 is also removed. However, not all of the lower polysilicon layer is removed so that the substrate 10 and gate oxide 18 remain covered by a portion of the lower layer 30.

A plasma etching step can be adjusted by changing a range of properties, such as the etch rate, selectivity between different materials, and anisotropic vs. isotropic nature of the etch. It is possible to manipulate a plasma etching step to yield certain properties, by selecting a particular chemistry through choosing a combination of gas chemicals, flow rates, pressure, power (there may be more than one depending on the design of the machine), and temperatures of the various component surfaces in contact with the plasma and semiconductor substrate. A plasma step will etch a material both laterally and vertically (relative to a thin layer). Depending on the process condition, relative etch rates along these two directions can be different and manipulated. When the lateral etch rate is negligible compared to etch rate in the vertical direction, the process is referred as anisotropic. An opposite condition is isotropic, when the etch rate along the vertical and lateral directions are the same. Often, etch rates along both directions have to be considered in real situations. It is necessary to employ a plasma step with desired characteristics in this area to yield a good profile and CD. The conditions to achieve this will vary depending on the materials. This is why it is difficult to etch both N doped and P or undoped polysilicon gate simultaneously to yield the same profile and CD.

In the present case, a more aggressive plasma process step is first used to partially etch both the N and P or undoped materials. This is a step, for example, that uses $HBr/O_2$ chemistry in a plasma etcher with two power controls: one (RF) controls the plasma density and the other (bias) manipulates the ion energy. At a higher bias condition, the etching tends to be more anisotropic so that the N doped and P doped or undoped gates will yield the same profile (because of the minimum lateral etching). The dopant is very sensitive to the lateral etching component. Other combinations of chemistry and plasma conditions that exhibit anisotropic characteristics can be utilized as an alternative. After this partial etch, a passivation step is performed and a second, less aggressive etch is performed. The second etch has a lower bias, such that it performs an anisotropic etch of the unprotected undoped polysilicon. The second, lower bias etch does not affect the oxide. While this lower bias etch would normally affect the doped portions, the passivation layer 50 protects the doped portions. Thus, the gate profiles produced for the N doped and P doped or undoped devices would be substantially similar. Also note, the depth the first step etches into the polysilicon can be controlled through the use of an end point instrument based on the optical interferometer technique.

Figure 5:
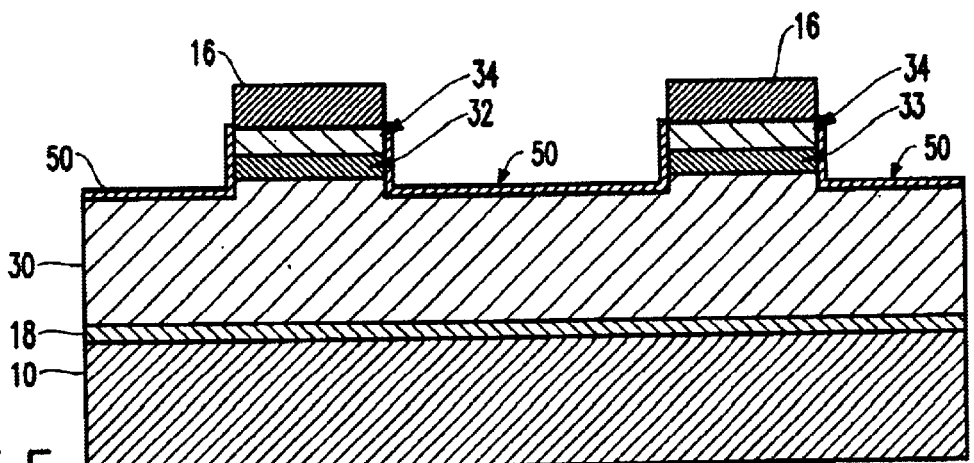
FIG. 5 is a schematic diagram of a partially completed semiconductor chip.

As discussed above, the invention forms a passivation layer 50 on the exposed surfaces (vertical and horizontal) of the polysilicon 30, 32, 33, 34, as shown in FIG. 5. The preferred method runs a short plasma step that uses O2 gas or N2 gas or a combination of the two in situ without removing the wafer from the plasma chamber between the first partial etch and the remaining etch steps. The short plasma step would produce an oxide or nitride (or a combination of the two) passivation 50 on the side wall of the partially etched gate structures. This passivation layer 50 can be formed using a standard oxidation process or a well-known nitride plasma deposition. A polymer producing plasma step can also be used to generate a protective polymer thin layer. One example is a $CH_2F_2$ chemistry based plasma step. Others are $CHF_3$, $C_4F_8$ or $C_5F_8$ chemistry based.

Figure 6:
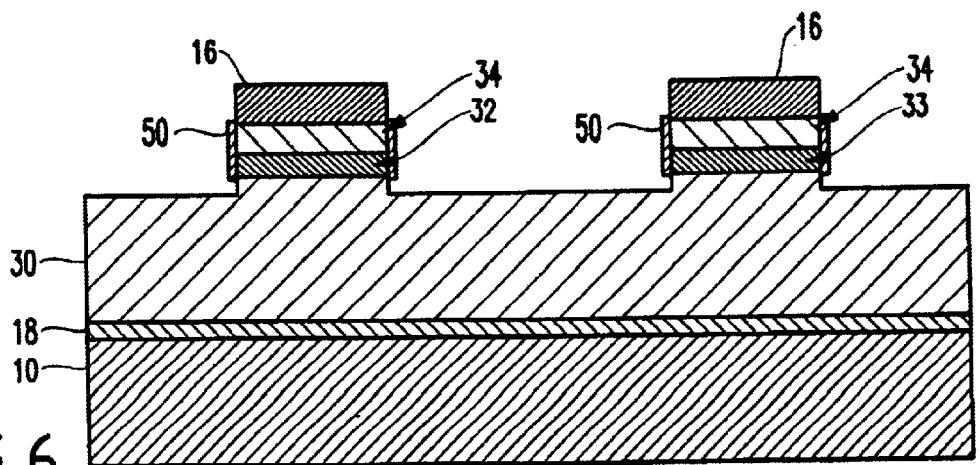
FIG. 6 is a schematic diagram of a partially completed semiconductor chip.

FIG. 6 illustrates the results of an anisotropic etching process (a process that removes material from horizontal surfaces at a substantially higher rate than it removes material from the vertical surfaces) that removes the passivation layer from the horizontal surfaces of the lower polysilicon layer 30. However, this etching process allows the passivation layer 50 to remain on the exposed sidewalls of the doped and undoped polysilicon layers 30, 32, 33, 34. For example, $HBr/O_2$ plasma step at a higher bias power is used. Others would be $Cl_2$, $CF_4$ or $CHF_3$ (all probably mixed with $O_2$) based.

Figure 2:
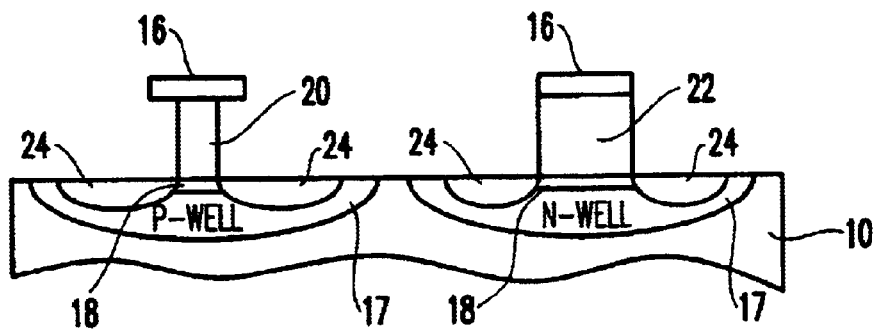
FIG. 2 is a schematic diagram of a partially completed semiconductor chip.

Next, in FIG. 7, another etching process is used to remove the remainder of the polysilicon 30 from areas that are not protected by the mask 16 to form the N-type gate conductor structure 70 and the P-type gate conductor 71. The passivation layer 50 prevents this etching process from affecting the shape of the middle layer 32, 33 and upper layer 34 of the upper portion of the gate conductors. Therefore, with the invention, the N-type gate conductors 70 will have substantially the same profile (e.g., shape and size) as the P-type gate conductors 71, as shown in FIG. 8. The advantages of the invention are clearly seen when FIG. 2 is compared to FIG. 8. More specifically, in FIG. 2 the profile difference between the N-type gate 20 and the P-type gate 22 is remarkable, while in FIG. 8, with the invention there is no substantial difference between the profiles of N-type gate 20 and the P-type gate 22.

With the invention, after the source/drain 24 implants are performed, the entire structure is annealed to allow the impurities within the middle layer 32, 33 to diffuse into the remaining polysilicon 30, 34 within the N-type gate conductor 70 and the P-type conductor 71. This annealing process also allows the source/drain 24 impurities to properly diffuse. The details of the annealing process are well known to those ordinarily skilled in the art and are not discussed herein in detail.

FIG. 9 illustrates a flowchart showing formation of the conductive layer on a substrate (90). Further, FIG. 9 shows patterning a mask (91) over the conductive layer. Next, FIG. 9 shows partially etching unprotected portions (92) of the conductive layer. FIG. 9 also describes forming a passivating layer (93) on exposed vertical surfaces of the conductive layer. Then FIG. 9 shows completely etching the unprotected portions (94) of the conductive layer. The invention further dopes exposed portions of the substrate to form source/drain 24 regions (95). Finally, the annealing of the semiconductor chip (96) is accomplished.

The passivation will be retained to the completion of the plasma process step used for forming the gate structure. After this step, the passivation layer will no longer be useful and will be removed during subsequent processing.

The invention solves the conventional uneven etching problems with processing that implants different regions with N-type and P-type dopants to form locally doped regions, patterns a mask, performs partial aggressive anisotropic etching of both N-type, P-type (and possibly non-doped type) regions past the locally doped areas, forms a passivation layer, less aggressively anisotropic etches to complete the formation of the gate conductor stacks, and then spreads the dopant throughout gate conductor stack (for example, by annealing). Afterwards, processing continues as normal, for example, the source/drain regions are doped, etc. With the invention, as shown in FIG. 8, there is no substantial difference between the profiles of N-type gate 20 and the P-type gate 22, even though a simultaneous less aggressive etching process is utilized.

While the invention has been described in terms of preferred embodiments, those skilled in the art will recognize that the invention can be practiced with modification within the spirit and scope of the appended claims.

What is claimed is:

1. A method of manufacturing a semiconductor chip, said method comprising;

forming a conductive layer on a substrate, forming a first doped layer in a first aerial region of said conductive layer, said first doped layer having a first type dopant, wherein an undoped lower portion of said conductive layer remains below said first doped layer;

forming a patterned mask over said conductive layer, wherein openings of said patterned mask delineate unprotected portions of said conductive layer;

partially etching said unprotected portions of said conductive layer to at least through said first doped layer to form substantially vertical surfaces, so that a substantial portion of said undoped lower portion remains intact;

forming a passivating layer on said substantially vertical surfaces of said conductive layer;

completely etching said unprotected potions of said conductive layer so that said substantially vertical surfaces are extended through said undoped lower portion to said substrate; and spreading said first dopant within said first aerial region of said conductive layer.

2. The method in claim 1, wherein said conductive layer includes a lower layer of undoped polysilicon, a middle layer of doped polysilicon, and an upper layer of undoped polysilicon, and wherein said partially etching process etches said unprotected portions of said conductive layer completely through said upper layer and said middle layer, and partially through said lower layer.

3. The method in claim 2, wherein said passivating layer is formed at least over vertical surfaces of said middle layer.

4. The method in claim 1, wherein said forming of said passivating layer comprises:

forming said passivating layer on said vertical surfaces and on horizontal surfaces of said conductive layer; and removing said passivating layer from said horizontal surfaces.

5. The method in claim 1, wherein said forming of said passivating layer comprises one of:

oxidizing said vertical surfaces of said conductive layer;

depositing a nitride material on said vertical surfaces of said conductive layer;

nitridizing said vertical surfaces of said conductive layer; and polymerizing said vertical surfaces of said conductive layer.

6. The method in claim 1, wherein said partially etching process exposes a sidewall of said conductive layer.

7. The method in claim 1, wherein said passivating layer protects sidewall portions of said conductive layer from lateral etching during said completely etching process.

8. A method of manufacturing a semiconductor chip having transistors, wherein said transistors include first type transistors having a first type of gate doping and second type transistors having a second type of gate doping different than said first type of gate doping, said method comprising:

forming a conductive layer on a substrate, wherein said conductive layer includes first regions having said first type of doping and second regions having said second type of doping;

patterning a mask over said conductive layer, wherein said mask protects portions of said conductive layer where gate conductors will be located;

partially etching unprotected portions of said conductive layer, wherein said partially etching process etches said conductive layer to a depth just below where said first type of doping is located;

forming a passivating layer on exposed vertical surfaces of said conductive layer;

completely etching said unprotected portions of said conductive layer to expose said substrate;

doping exposed portions of said substrate to form source and drain regions; and annealing said semiconductor chip.

9. The method in claim 8, wherein said conductive layer includes a lower layer of undoped polysilicon, a middle layer of doped polysilicon containing said first type of doping and said second type of doping, and an upper layer of undoped polysilicon, and wherein said partially etching process etches said unprotected portions of said conductive layer completely through said upper layer and said middle layer, and partially through said lower layer.

10. The method in claim 9, wherein said passivating layer is formed at least over vertical surfaces of said middle layer.

11. The method in claim 8, wherein said forming of said passivating layer comprises:

forming said passivating layer on said vertical surfaces and on horizontal surfaces of said conductive layer; and removing said passivating layer from said horizontal surfaces.

12. The method in claim 8, wherein said forming of said passivating layer comprises one of:

oxidizing said vertical surfaces of said conductive layer;

depositing a nitride material on said vertical surfaces of said conductive layer;

nitridizing said vertical surfaces of said conductive layer; and polymerizing said vertical surfaces of said conductive layer.

13. The method in claim 8, wherein said partially etching process exposes a sidewall of said conductive layer.

14. The method in claim 8, wherein said passivating layer protects sidewall portions of said conductive layer from lateral etching during said completely etching process.

15. A method of manufacturing a semiconductor chip, said method comprising:

partially etching unmasked portions of non-annealed, first-type conductive layers and second-type conductive layers below a middle layer of impurities;

forming a passivating layer on exposed vertical surfaces of said first-type conductive layers; and simultaneously etching said unmasked portions of said first-type conductive layers and said second-type conductive layers.

16. The method in claim 15, wherein said first-type conductive layers include a lower layer of undoped polysilicon, said middle layer, and an upper layer of undoped polysilicon, and wherein said partially etching process etches said unmasked portions of said conductive layer through said upper layer and said middle layer, and partially through said lower layer.

17. The method in claim 16, wherein said passivating layer is formed at least over vertical surfaces of said middle layer.

18. The method in claim 15, wherein said forming of said passivating layer comprises:

forming said passivating layer on said vertical surfaces and on horizontal surfaces of said conductive layer; and removing said passivating layer from said horizontal surfaces.

19. The method in claim 15, wherein said forming of said passivating layer comprises one of:

oxidizing said vertical surfaces of said conductive layer;

depositing a nitride material on said vertical surfaces of said conductive layer;

nitridizing said vertical surfaces of said conductive layer; and polymerizing said vertical surfaces of said conductive layer.

20. The method in claim 15, wherein said partially etching process exposes a sidewall of a doped region of said first-type conductive layer.

* * * * *